US 7,750,619 B2

(12) United States Patent
Fawley

(10) Patent No.: US 7,750,619 B2
(45) Date of Patent: Jul. 6, 2010

(54) METHOD AND APPARATUS FOR MEASURING THE FREQUENCY OF A RECEIVED SIGNAL

(75) Inventor: Richard Fawley, Shipley (GB)

(73) Assignee: Teledyne Defence Limited, West Yorkshire (GB)

( * ) Notice: Subject to any disclaimer, the term of this patent is extended or adjusted under 35 U.S.C. 154(b) by 339 days.

(21) Appl. No.: 11/662,714

(22) PCT Filed: Sep. 13, 2005

(86) PCT No.: PCT/GB2005/003511

§ 371 (c)(1),
(2), (4) Date: Oct. 16, 2007

(87) PCT Pub. No.: WO2006/030188

PCT Pub. Date: Mar. 23, 2006

(65) Prior Publication Data

US 2008/0211482 A1     Sep. 4, 2008

(30) Foreign Application Priority Data

Sep. 13, 2004   (GB) .................................. 0420241.2

(51) Int. Cl.
*G01R 19/00* (2006.01)
*G01R 19/18* (2006.01)
(52) U.S. Cl. .................. 324/76.52; 324/76.11; 324/118
(58) Field of Classification Search .............. 324/76.52, 324/118, 76.11
See application file for complete search history.

(56) References Cited

U.S. PATENT DOCUMENTS

| 3,992,666 A | * | 11/1976 | Edwards et al. ........... 324/76.24 |
| 4,504,786 A | * | 3/1985 | Slaughter .................. 324/76.39 |
| 4,675,614 A | * | 6/1987 | Gehrke .......................... 327/3 |
| 5,019,823 A | * | 5/1991 | Bream et al. ................. 342/175 |
| 5,440,228 A | | 8/1995 | Schmidt |
| 6,639,476 B1 | | 10/2003 | Sullivan |

FOREIGN PATENT DOCUMENTS

| EP | 0373802 | 6/1990 |
| EP | 0695028 | 1/1996 |
| EP | 1450170 | 8/2004 |
| WO | 2006030188 | 3/2006 |

OTHER PUBLICATIONS

International Search Report and Written Opinion, International Application No. PCT/GB2005/003511 and filing date Sep. 13, 2005.

* cited by examiner

*Primary Examiner*—Timothy J Dole
*Assistant Examiner*—Farhana Hoque
(74) *Attorney, Agent, or Firm*—Howard & Howard Attorneys PLLC

(57) ABSTRACT

A method of measuring the frequency of a received signal comprising the steps of: generating a first phase signal by digitising the phase of the received signal; delaying the first phase signal by a predetermined amount to generate a second phase signal; calculating a phase difference between the first and the second phase signals; and calculating the frequency of the input signal from the phase difference.

12 Claims, 3 Drawing Sheets

METHOD AND APPARATUS FOR MEASURING THE FREQUENCY OF A RECEIVED SIGNAL

The subject patent application claims priority to and all the benefits of International Application No. PCT/GB2005/003511, which was filed on 13 Sep. 2005 with the World Intellectual Property Organization.

The present invention relates a method of measuring the frequency of a received signal. The present invention also relates to an apparatus for measuring the frequency of a received signal. It can be applied to a frequency counter.

There exists a need to analyse a received signal in a given frequency band and determine the frequency of a signal present at a particular frequency within the band. This is generally known as frequency measurement.

A device known as a Delay Line Correlator can be used for frequency measurement. However, a Delay Line Correlator is implemented entirely by analogue components and consequently can be expensive to manufacture. It also has relatively high power consumption requirements and often has a large physical volume.

The delay line correlator operates by comparing the phase of a received signal with a delayed version of the signal. Mixers are used to determine the frequency of the signal depending on the result of the comparison.

Digital frequency measurement devices have also been proposed. These apply signal processing techniques such as fourier transforms to a sampled version of the received signal to derive the frequency of the received signal.

In a wideband digital frequency measurement device short pulses are typically analysed over a large dynamic range. However this requires complex analogue-to-digital converters (ADCs) and a large amount of processing to cope with the frequency range, which may have an upper limit of 2 GHz or more.

In a narrowband digital device, a heterodyne is used to achieve increased resolution and sensitivity with reduced complexity in the ADC and processor. However such a device can only cover a narrow frequency band and therefore cannot cover a wide band of interest (such as 0.5 to 2 GHz) simultaneously.

In view of the above, it is an object of the invention to provide an improved method and apparatus for measuring frequency using digital components.

According to a first aspect of the invention, there is provided a method of measuring the frequency of a received signal comprising the steps of:
  generating a first phase signal by digitising the phase of the received signal;
  delaying the first phase signal by a predetermined amount to generate a second phase signal;
  calculating a phase difference between the first and the second phase signals; and
  calculating the frequency of the input signal from the phase difference.

The predetermined amount of delay preferably corresponds to an integer multiple of the length of one sampling period used when generating the first phase signal.

This allows digital components to be used to execute the method without requiring expensive digitisation and processing. Unlike prior digital methods, the method does not use signal processing techniques such as Fourier transforms. Unlike prior analogue methods, the method can be implemented without the need for mixers (or their digital equivalent of multipliers) in the calculation of the phase difference, reducing complexity.

Preferably, the step of generating a first phase signal comprises:
  splitting the received signal into in-phase and quadrature components, thereby generating a received in-phase signal and a received quadrature signal;
  digitising the received in-phase signal thereby generating a digitised received in-phase signal;
  digitising the received quadrature signal thereby generating a digitised received quadrature signal; and
  generating a first phase signal from the digitised received in-phase signal and the digitised received quadrature signal.

This allows the phase of the received signal to be digitised using standard components. The combination of the in-phase and quadrature signal together represent the signal in complex format and allow the phase to be derived.

Preferably, the method further comprises limiting the amplitude of the signal prior to the step of splitting the received signal into in phase and quadrature components.

By limiting the amplitude, the resolution required to digitise the signal can be reduced.

Preferably, the steps of digitising use a one-bit resolution, such that the digitised received in-phase signal and the digitised received quadrature signal each comprise a succession of single bits representing the signal value at a particular instant in time.

By using a one-bit resolution, so that each sample has only two possible values the processing requirements can be further reduced.

Preferably, the method further comprises deserialising the succession of single bits of the digitised received in-phase signal and the digitised received quadrature signal into words having a predetermined number of bits.

If the succession of single bit samples is grouped together into words having a predetermined number of bits, those words can then be processed at a lower clock speed thereby allowing the use of a processor with a lower clock speed. Advantageously, the predetermined number can correspond to the internal word length used when processing. Likewise, the predetermined number can be of the form $2^n$ where n is an integer greater than or equal to 1.

Preferably, the method further comprises further comprising:
  converting the phase difference into in-phase and quadrature components, thereby generating a phase difference in-phase signal and a phase difference quadrature signal;
  filtering the phase difference in-phase signal thereby generating a filtered phase difference in-phase signal;
  filtering the phase difference quadrature signal thereby generating a filtered phase difference quadrature signal;
  generating a filtered phase difference signal from the filtered phase difference in-phase signal and the filtered phase difference quadrature signal; and
  using the filtered phase difference signal in the step of calculating the frequency of the received signal.

By filtering the signal the effective resolution can be increased. This allows a lower sampling resolution to be used while still achieving good resolution.

In one embodiment, the filter is a moving average filter.

Preferably, the step of calculating the frequency of the received signal uses the formula:

$$f = \frac{\Delta \phi F_s}{2\pi d} \text{Hz}$$

where f is the frequency of the received signal, $F_s$ is the sampling frequency used when digitising the signal, and d is the predetermined amount of delay used in the step of delaying expressed a number of sample periods.

This formula can be implemented in a simple manner without requiring complex processing.

Preferably, the method is executed at least twice using a different value for the predetermined amount of delay in the step of delaying.

By implementing the method more than once with a different value for the delay, cyclic (or ambiguous) frequencies can have their frequency correctly identified.

According to a second aspect of the present invention, there is provided an apparatus for measuring the frequency of a received signal, the apparatus comprising:

digitisation means for digitising the phase of the received signal and generating a first phase signal;

delay means for delaying the first phase signal by a predetermined amount to generate a second phase signal; and processing means for calculating a phase difference between the first and the second phase signals and for calculating the frequency of the received signal from the phase difference.

Thus, the method of the first aspect can be implemented without requiring expensive specialist hardware.

Preferably, the digitisation means comprises:

a signal splitter for splitting the received signal into in-phase and quadrature components, thereby generating a received in-phase signal and a received quadrature signal;

a first analogue-to-digital converter for digitising the received in-phase signal thereby generating a digitised received in-phase signal;

a second analogue-to-digital converter for digitising the received quadrature signal thereby generating a digitised received quadrature signal; and means for resolving the phase of the received signal from the digitised received in-phase signal and the digitised received quadrature signal and for outputting the first phase signal.

Preferably, the apparatus further comprises a limiting amplifier connected to the input of the signal splitter.

Preferably, the first and second analogue-to-digital convertors are single bit devices, preferably comparators Preferably, the apparatus further comprises a first deserialiser connected to the output of the first analogue to digital convertor for deserialising the output from the first analogue-to-digital convertor and for outputting words having a predetermined number of bits; and a second deserialiser connected to the output of the first analogue to digital convertor for deserialising the output from the second analogue-to-digital convertor and for outputting words having a predetermined number of bits.

Deserialiser is used to refer to any device with can convert a serial bitstream into a parallel bit stream of a given word length.

Preferably, the processing means further comprises:

means for converting the phase difference into in-phase and quadrature components, thereby generating a phase difference in-phase signal and a phase difference quadrature signal;

a first digital filter for filtering the phase difference in-phase signal thereby generating a filtered phase difference in-phase signal;

a second digital filter for filtering the phase difference quadrature signal thereby generating a filtered phase difference quadrature signal; and means for generating a filtered phase difference signal from the filtered phase difference in-phase signal and the filtered phase difference quadrature signal;

wherein the filtered phase difference signal is used in the calculation of the frequency of the received signal.

Preferably, the first and second digital filters are moving average filters.

Preferably, the processing means is adapted to calculate the frequency using the formula:

$$f = \frac{\Delta \phi F_s}{2\pi d} \text{Hz}$$

where f is the frequency of the received signal, $F_s$ is the sampling frequency used by the analogue-to-digital convertors the signal, and d is the predetermined amount of delay used in the step of delaying expressed a number of sample periods.

Preferably, the apparatus further comprises at least two delay means each of which delays the signal by a different amount.

Preferably, the delay means and the processing means are implemented in a Field Programmable Gate Array.

A Field Programmable Gate Array is a standard component which can be programmed at the point of manufacture to operate in a particular way. It therefore allows a cost-effective implementation of the invention.

Other devices such as a programmable DSP or microprocessor could also be used for the processing means.

Embodiments of the invention will now be described with reference to the accompanying drawings, in which.

According to a first embodiment, an apparatus (or receiver) for frequency measurement performs frequency discrimination by measuring the differential phase between two time-separated versions of an input signal. Unlike an analogue delay line correlator, the input signal is digitised, and phase discrimination subsequently performed in the digital domain using a high speed Field Programmable Gate Array. A block diagram of the receiver according to this embodiment is shown in FIG. 1.

Figure 1:
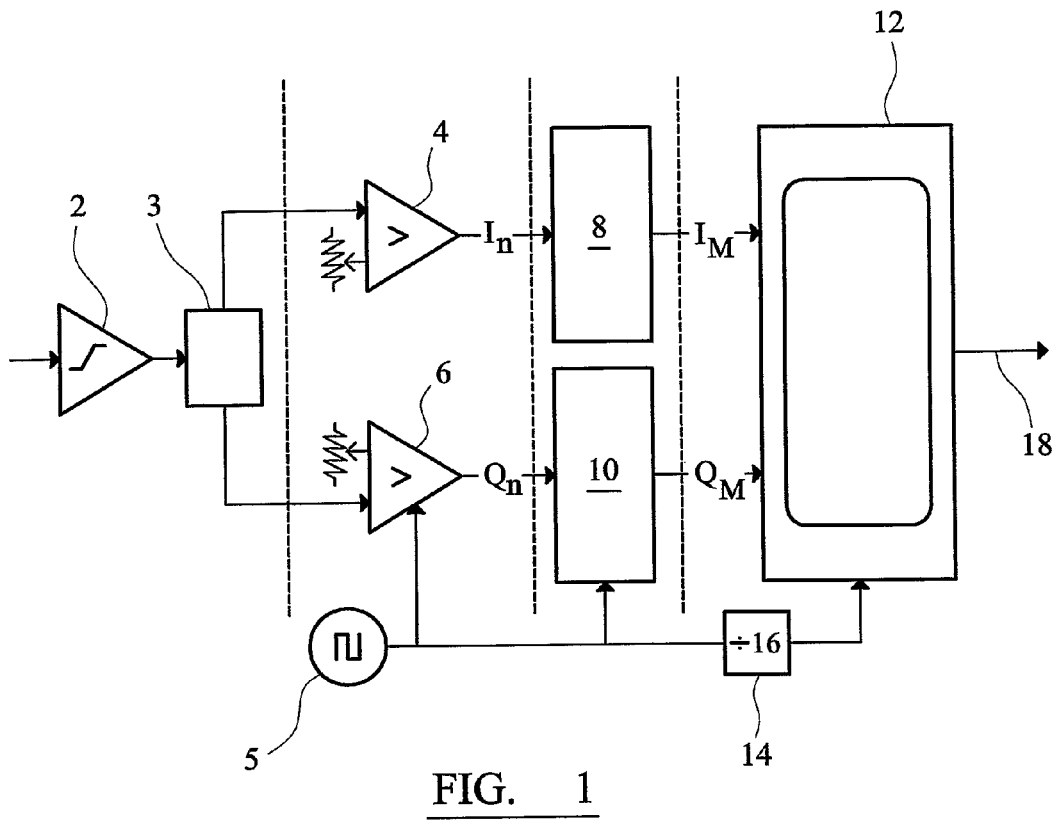
FIG. 1 depicts a block diagram of a frequency measurement receiver according to a first embodiment of the present invention.

Referring to FIG. 1, in general terms a limiting amplifier 2 compresses the input signal dynamic range such that a pair of high-speed comparators 4 and 6 can perform I-Q phase digitisation. The high-speed comparators operate at a sampling frequency $F_s$. This generates two serial datastreams $I_n$ and $Q_n$ which are then fed into 1:16 de-serialisers 8 and 10 which produce 16-bit words ($I_M$ and $Q_M$) at $\frac{1}{16}^{th}$ of the sampling frequency. All subsequent processing is performed by an FPGA at this reduced rate.

A more detailed description of each component of FIG. 1 will now follow.

The use of a limiting amplifier 2 strips all amplitude information from the input signal and therefore the digital correlation receiver is only able to process one pulse at a time. The limiting amplifier 2 is connected to an I-Q generator 3.

The I-Q generator 3 is used because a complex representation of the input signal is required. In this embodiment the I-Q generator 3 is either a distributed or a lumped-element realisation of a quadrature hybrid. Only a single hybrid is required and thus tracking errors introduced by multiple distributed element components are eliminated.

The output of the I-Q generator 3 is connected to the high-speed comparators 4 and 6. A clock 5 controls the sampling frequency and operates at a rate greater than the bandwidth of the input signal. The high-speed comparators 4 and 6 must also be capable of tracking analogue signals in the band of interest. Providing the latter requirement is met, sub-Nyquist sampling can be implemented and any band (of width $F_s$ Hz) can be analysed without ambiguity. Thus, for example, to analyse a band of 0.5 to 2 GHz a sampling frequency of 2 GHz is required. In this embodiment a sampling frequency of 2 GHz is used. The high speed comparators 4 and 6 produce an output of a bitstream of successive single-bit sample values at the sampling frequency; signals $I_n$ and $Q_n$ respectively.

The output of the high-speed comparators 4 and 6 is connected to the deserialisers 8 and 10 respectively. These reduce the data rate of the data streams $I_n$ and $Q_n$ by combining several successive bits into longer length words output at a slower rate this allows the signal to be processed at a slower rate than the sampling rate. Deserialisers operating at 2.5 gigabits per second are readily available and may also provide appropriately divided clocks as an output. In this embodiment the deserialisers 8 and 10 output data in words having a length of 16 bits. The data streams of these 16-bit words are indicated in FIG. 1 by $I_m$ and $Q_m$.

Careful phase alignment of the deserialisers 8 and 10 is required. This is performed at power-up to ensure proper operation of the receiver.

The signals $I_m$ and $Q_m$ are provided to a Field Programmable Gate Array (FPGA) 12. The FPGA 12 processes the signals $I_m$ and $Q_m$ using a clock frequency equal to 1/16th that of the clock 5 because each 16 bit word contains 16 samples. Thus, it also produces updated frequency data 18 at a rate of $F_s/16$. In order to supply the correct clock frequency to the FGPA 12, a divider 14 divides the signal from the clock 5 by 16 for supply to the FPGA 12. Therefore, in this embodiment, the FPGA is clock at 125 MHz.

Although in this embodiment the frequency discrimination is performed in a continuously clocked fashion, asynchronous triggered operation is possible in alternative embodiments due to the relatively high processing rate of the FPGA.

Figure 2:
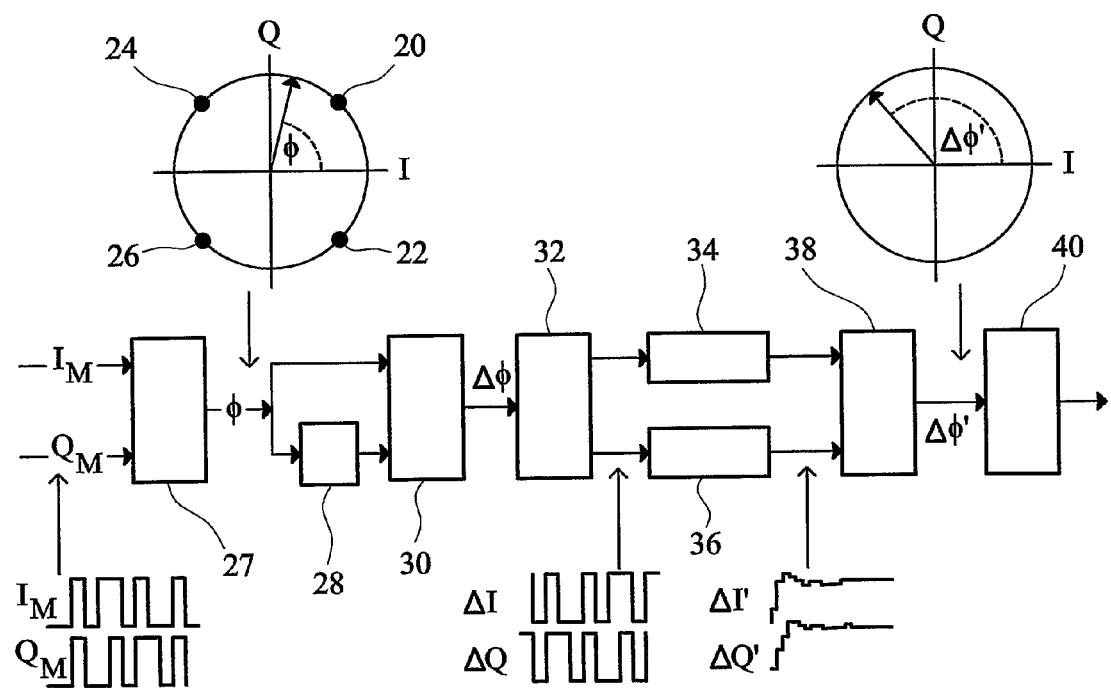
FIG. 2 depicts a block diagram of the processing to calculate a received frequency according to the first embodiment.

The processing carried out by the FPGA 12 will now be described. A block diagram showing the processing required is depicted in FIG. 2.

The use of single bit comparators 4 and 6 results in the two digitised signals $I_M$ and $Q_M$ effectively resolving the phase of the input signal to four states. As depicted in FIG. 2A the phase φ can be resolved to any of the states 20, 22, 24, 26. The phase 4) is resolved by the block 27. The quantised phase representation φ is delayed by a number of sample clock cycles in the delay block 28. The phase difference between the undelayed and the delayed signals is then calculated in block 30, producing a two-bit, low resolution estimate of the differential phase Δφ. (Once again, this is resolved into four possible states). This estimate is converted to IQ format by block 32 to produce signals ΔI and ΔQ.

The signals ΔI and ΔQ are then filtered by filters 34 and 36. This has the beneficial result of increasing the resolution of the phase estimate, and an improved differential phase estimate Δφ' is generated by resolving the phase from the filtered signals ΔI' and ΔQ' in block 38. In this embodiment the filters 34 and 36 are both moving average filters, although other filter types could also be used.

The frequency, f, of the input signal can be derived by block 40 from the differential phase estimate Δφ' as follows:

$$f = \frac{\Delta\phi F_s}{2\pi d} \text{Hz} \qquad (1)$$

where d is the number of sample delays in the delay block 28, and $F_s$ is input sample rate. Improved resolution can be achieved by increasing the delay in delay block 28. Cyclic (and therefore ambiguous) frequency estimates can be resolved by using multiple correlators each using varying delays. All correlators are implemented within a single FPGA, unlike prior proposed frequency measurement apparatus, and therefore an extremely compact solution is realised.

In this embodiment the correlation process uses the principle of over-sampling an input signal using low-bit resolution sampling devices (the high-speed comparators 4 and 6). The digital data is subsequently filtered to reduce the quantisation noise introduced during the sampling process.

The performance of the system will now be discussed, particularly in relation to the noise introduced.

The quantisation noise introduced during the digitisation process in the high speed comparators 4 and 6 is of the same order as the noise present in the input signal when the correlator operates in poor signal-to-noise ratio (SNR) environments. Both the noise present in the input signal and the quantisation noise contribute to the output noise and as a result define the frequency accuracy performance of the apparatus. An analysis of both these noise components is given below.

Figure 3A:
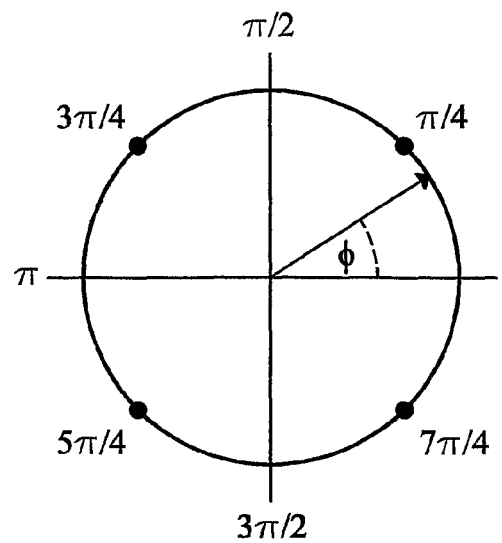
FIGS. 3A, 3B and 3C illustrate the incidence of quantisation noise in the first embodiment.
Figure 3B:
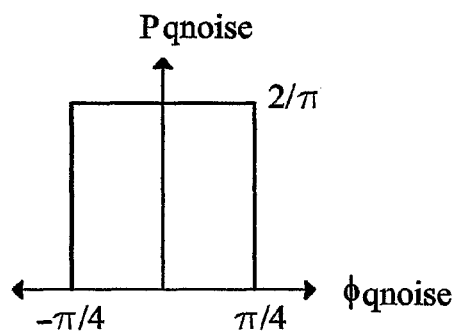
Figure 3C:
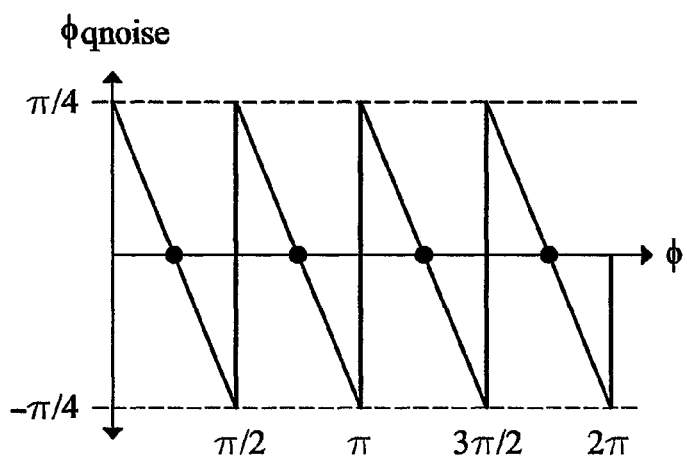

FIG. 3A depicts the four states into which the phase of the signal can be resolved. FIG. 3B illustrates how the quantisation noise changes, as the absolute phase φ of the input signal is resolved to one of the four phase states depicted in FIG. 3A. Assuming the quantisation noise samples are statistically independent (i.e. uncorrelated with the sample clock and with each other), the noise is uniformly distributed as shown in FIG. 3C and can be shown to have a standard deviation or RMS value of $$\sigma_{qnoise} = \frac{\sqrt{3}}{12}\pi \text{ radians} \qquad (2)$$

Using standard phase noise theory, the phase noise at the output of a phase detector for a given SNR, S is:

$$\sigma_{Snoise} = \frac{1}{\sqrt{2}S} \text{radians} \qquad (3)$$

These two noise components, $\sigma_{qnoise}$ and $\sigma_{Snoise}$ are statistically independent; the noise present at the output of the phase discriminator (before filtering by filters 34 and 36) is therefore:

$$\sigma_{noise} = \sqrt{\sigma_{qnoise}^2 + \sigma_{Snoise}^2} \text{ radians} \quad (4)$$

In this embodiment the filters 34 and 36 are moving average filters, which is optimal for this embodiment. The filters 34 and 36 average N adjacent samples are averaged, reducing the RMS noise by $\sqrt{N}$. In this embodiment the value of N is 64 and therefore the RMS noise is reduced by a factor of eight. Different values of N may also be used.

The assumption in the calculations above that successive quantisation noise samples are uncorrelated is valid for all but a few cases of input frequencies (and phase relative to the sample clock). It can be shown that within four bands of input signal frequency defined by:

$$\frac{F_s}{k} + \frac{F_s}{N} \text{ Hz} \quad (5)$$

where N is the order of the filter, $F_s$ is the sample rate and k is an integer k=1.4; quantisation noise samples are correlated resulting in a localised loss of sensitivity. In practice, system noise will tend to de-correlate this noise therefore reducing its effect.

A specific example of a hardware implementation of this embodiment will now be described. This example hardware implementation has the following target specification and performance attributes:

- The sample rate is 2 Gsps, with an unambiguous bandwidth of 2 GHz
- 125 MHz correlator processing rate
- 50 ns pulse-width capability
- 7-bit resolution for each discriminator.
- 4-correlators are used in the design to give a robust solution.
- There is 125 MHz unambiguous bandwidth for a 'fine discriminator', resulting in a approximately 1 MHz resolution.
- Measurement Delay: 120 ns A VHDL design of this embodiment has been implemented and full timing driven gate level simulations performed. The results of the simulation of a single correlator are shown in FIG. 4.

Figure 4:
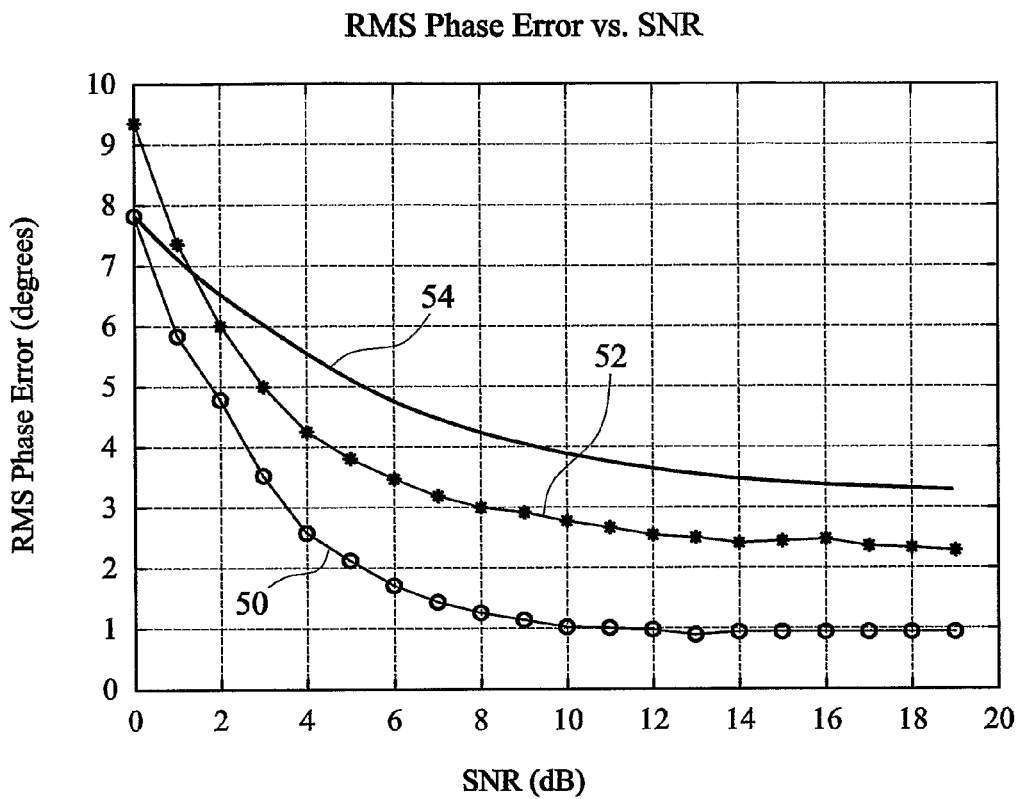
FIG. 4 illustrates the simulated performance of the first embodiment.

FIG. 4 shows The RMS phase error is shown for different input SNR conditions for two digital delay correlator sample delays; a 1 sample delay (curve 50) and a 16-sample delay (curve 52). The theoretical performance is also shown as curve 54, which is calculated from equation (4). It is clear that the simulation performs better than the theory suggests. It is thought that the improved performance is a result of in-phase correlation effects experienced in phase discriminator correlator designs. The fact that the short delay design appears to perform better than the long delay correlator supports this assumption.

It is possible to estimate the frequency accuracy performance of a design for a given input SNR thus:

The 16 sample delay 'fine discriminator' (with performance depicted by curve 52) defines the frequency accuracy. This will have an unambiguous bandwidth of 2 GHz/16=125 MHz. From FIG. 4, the RMS phase error for 3 dB SNR is approximately 5° The frequency error is therefore 5/360× 125≈1.7 MHz RMS The design described above was targeted towards FGPAs which are commercially available from Xilinx and sold under the mark Spartan-3. These are low-cost, high performance parts. These devices also have a large amount of on-board memory, which can be used as fast look-up-tables carrying calibration data to overcome non-ideal behaviour of the analogue components.

A four-correlator design when targeted to an XC3S400 device (which is a member of the Xilinx Spartan-3 device family) uses less than 12% of the available logic resources. Gate-level timing simulations show that this design can be clocked at over 150 MHz (as opposed to the 125 MHz required). This margin could be exploited by reducing the amount of pipelining used in the design to decrease the measurement delay, or indeed the system clock rate could be increased to improve the resolution (i.e. increase the oversampling rate).

Simulation results state that the power dissipation of the FPGA design is around 1.2 W. Dissipation of other components such as the de-serialisers, digitisers and limiting amplifier suggest that the dissipation of the complete receiver would be around 3.3 W. This is approximately one third of that typically dissipated by existing analogue frequency measurement devices. Furthermore, a double-sided PCB design can be realised with approximate dimensions of 100×100×15 mm which is a quarter of the volume occupied by existing 2-18 GHz analogue frequency measurement devices.

Figure 5:
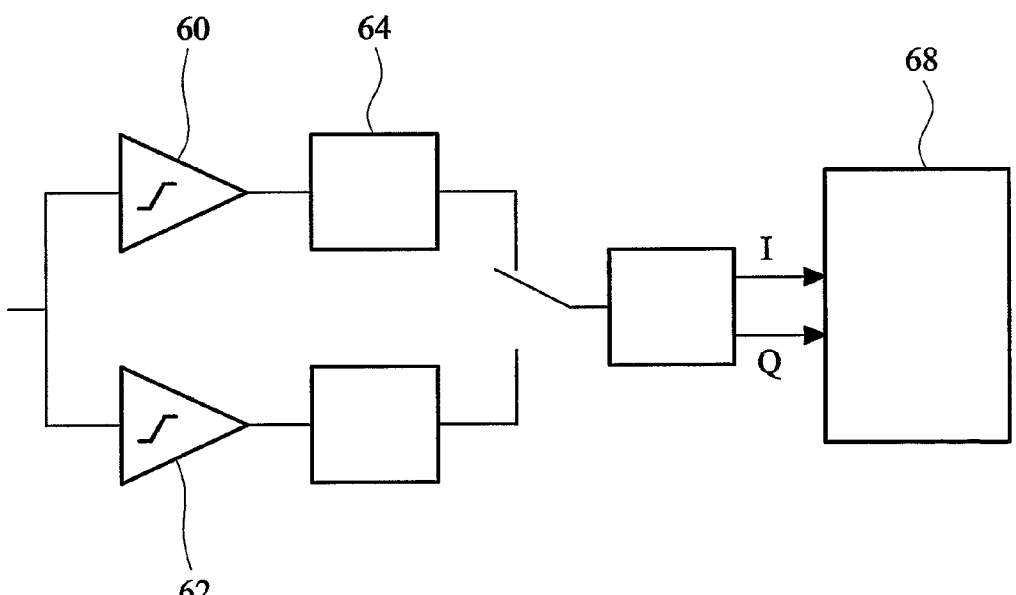
FIG. 5 depicts a block diagram of a second exemplary embodiment.

FIG. 5 depicts a block diagram of a second embodiment of the invention. It shows how a static microwave frequency divider could be used to implement a compact 2-18 GHz receiver.

The embodiment uses two limiting amplifiers 60 and 62. Limiting amplifier 62 is operative for frequencies in the range 0.5 to 2 GHz and Limiting amplifier 60 is operative for frequencies in the range 2 to 18 GHz. The output of limiting amplifier 60 is connected to a prescaler 64 which divides by 8 and produces an output in the range 0.25 to 2.25 GHz.

A multi-octave I-Q generator 66 generates an in-phase and quadrature component signals to supply to the digital correlator 68.

The multi-octave I-Q generator 66 could be implemented digitally using high speed flip-flops and absorbed into the frequency division operation, this would provide for an extremely robust receiver design with 'zero' alignment.

In an alternate embodiment the in-phase and quadrature signals are digitised with a resolution higher than one bit.

The invention claimed is:

1. A method of measuring the frequency of a received signal comprising the steps of:

generating a first phase signal by digitizing the phase of the received signal, said step of generating a first phase signal including limiting the amplitude of the received signal, splitting the amplitude limited received signal into in-phase and quadrature components, thereby generating a received in-phase signal and a received quadrature signal, digitizing the received in-phase signal using a one-bit resolution, thereby generating a digitized received in-phase signal having a succession of single bits representing the signal value at a particular instant in time, digitizing the received quadrature signal using a one-bit resolution, thereby generating a digitized received quadrature signal having a succession of single bits representing the signal value at a particular instant in time, and deserializing the succession of single bits of the digitized received in-phase signal and the digitized received quadrature signal into words having a predetermined number of bits;

delaying the first phase signal by a predetermined amount to generate a second phase signal;
calculating a phase difference between the first and the second phase signals; and
calculating the frequency of the input signal from the phase difference.

2. A method according to claim 1, further comprising the steps of:
converting the phase difference into in-phase and quadrature components, thereby generating a phase difference in-phase signal and a phase difference quadrature signal;
filtering the phase difference in-phase signal thereby generating a filtered phase difference in-phase signal;
filtering the phase difference quadrature signal thereby generating a filtered phase difference quadrature signal;
generating a filtered phase difference signal from the filtered phase difference in-phase signal and the filtered phase difference quadrature signal; and
using the filtered phase difference signal in the step of calculating the frequency of the received signal.

3. A method according to claim 2, wherein the filter used in the steps of filtering is a moving average filter.

4. A method according to claim 1 wherein the step of calculating the frequency of the received signal uses the formula:

$$f = \frac{\Delta\phi F_s}{2\pi d} \text{Hz}$$

where f is the frequency of the received signal, $F_s$ is the sampling frequency used when digitizing the signal, and d is the predetermined amount of delay used in the step of delaying expressed as a number of sample periods.

5. A method according to claim 1, wherein the method is executed at least twice using a different value for predetermined amount of delay in the step of delaying.

6. An apparatus for measuring the frequency of a received signal, the apparatus comprising:
a limiting amplifier for limiting the amplitude of the received signal;
digitization means for digitizing the phase of the received signal and generating a first phase signal, the digitization means including
a signal splitter having an input connected to the output of the limiting amplifier for splitting the received signal into in-phase and quadrature components, thereby generating a received in-phase signal and a received quadrature signal,
a first single-bit analog-to-digital converter for digitizing the received in-phase signal thereby generating a digitized received in-phase signal,
a second single-bit analog-to-digital converter for digitizing the received quadrature signal thereby generating a digitized received quadrature signal,
a first deserializer connected to the output of the first analog-to-digital converter for deserializing the output from the first analog-to-digital converter and for outputting words having a predetermined number of bits, and
a second deserializer connected to the output of the second analogue-to-digital converter for deserializing the output from the second analog-to-digital converter and for outputting words having a predetermined number of bits;

delay means for delaying the first phase signal by a predetermined amount to generate a second phase signal; and
processing means for calculating a phase difference between the first and the second phase signals and for calculating the frequency of the received signal from the phase difference.

7. An apparatus according to claim 6, wherein the processing means further comprises:
means for converting the phase difference into in-phase and quadrature components, thereby generating a phase difference in-phase signal and a phase difference quadrature signal;
a first digital filter for filtering the phase difference in-phase signal thereby generating a filtered phase difference in-phase signal;
a second digital filter for filtering the phase difference quadrature signal thereby generating a filtered phase difference quadrature signal; and
means for generating a filtered phase difference signal from the filtered phase difference in-phase signal and the filtered phase difference quadrature signal; wherein the filtered phase difference signal is used in the calculation of the frequency of the received signal.

8. An apparatus according to claim 7, wherein the first and second digital filters are moving average filters.

9. An apparatus according to claim 8, wherein the processing means is adapted to calculate the frequency using the formula:

$$f = \frac{\Delta\phi F_s}{2\pi d} \text{Hz}$$

where f is the frequency of the received signal, $F_s$ is the sampling frequency used by the analogue-to-digital converters the signal, and d is the predetermined amount of delay used in the step of delaying expressed as a number of sample periods.

10. An apparatus according to claim 6, further comprising at least two delay means each of which delays the signal by a different amount.

11. An apparatus according to claim 6, wherein the delay means and the processing means are implemented in a Field Programmable Gate Array.

12. A method of measuring the frequency of a received signal comprising the steps of:
generating a first phase signal by digitizing the phase of the received signal;
delaying the first phase signal by a predetermined amount to generate a second phase signal;
calculating a phase difference between the first and the second phase signals; and
calculating the frequency of the input signal from the phase difference using the formula:

$$f = \frac{\Delta\phi F_s}{2\pi d} \text{Hz}$$

where f is the frequency of the received signal, $F_s$ is the sampling frequency used when digitizing the signal, and d is the predetermined amount of delay used in the step of delaying expressed as a number of sample periods.

* * * * *

UNITED STATES PATENT AND TRADEMARK OFFICE
CERTIFICATE OF CORRECTION

PATENT NO.        : 7,750,619 B2
APPLICATION NO.   : 11/662714
DATED             : July 6, 2010
INVENTOR(S)       : Richard Fawley Page 1 of 1

It is certified that error appears in the above-identified patent and that said Letters Patent is hereby corrected as shown below:

Column 10, lines 35-36, after "converters" delete "the signal"

Signed and Sealed this

Thirty-first Day of August, 2010

David J. Kappos
*Director of the United States Patent and Trademark Office*